(12) United States Patent
Kar-Roy et al.

(10) Patent No.: US 7,704,874 B1
(45) Date of Patent: Apr. 27, 2010

(54) METHOD FOR FABRICATING A FRONTSIDE THROUGH-WAFER VIA IN A PROCESSED WAFER AND RELATED STRUCTURE

(75) Inventors: Arjun Kar-Roy, Irvine, CA (US);
Marco Racanelli, Santa Ana, CA (US);
David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 129 days.

(21) Appl. No.: 11/641,500

(22) Filed: Dec. 18, 2006

Related U.S. Application Data

(60) Provisional application No. 60/849,140, filed on Oct. 2, 2006.

(51) Int. Cl.
*H01L 21/4763* (2006.01)
(52) U.S. Cl. .................. 438/637; 438/620; 438/672; 438/673; 438/E23.01; 257/624; 257/758; 257/E23.495
(58) Field of Classification Search ......... 438/618–624, 438/637–638, 672–673, 700; 257/621, 758
See application file for complete search history.

(56) References Cited

U.S. PATENT DOCUMENTS 6,747,354 B2 * 6/2004 Kim et al. ................ 257/751

2007/0178694 A1 * 8/2007 Hiatt .......................... 438/667

OTHER PUBLICATIONS

Wu et al, *A High Aspect-Ratio Silicon Substrate-Via Technology and Applicatins: Through-Wafer Interconnects for Power and Ground and Faraday Cages for SOC Isolation*, IEDM, 477-480 (2000).

* cited by examiner

*Primary Examiner*—Dung A. Le
(74) *Attorney, Agent, or Firm*—Farjami & Farjami LLP

(57) ABSTRACT

According to an exemplary embodiment, a method for fabricating a frontside through-wafer via in a processed wafer includes forming a through-wafer via opening through at least one interlayer dielectric layer in a through-wafer via region of the processed wafer. The method further includes extending the through-wafer via opening through a substrate to a target depth. The method further includes forming a first conductive layer in the through-wafer via opening and over a through-wafer via pad, which is situated over the at least one interlayer dielectric layer. The first conductive layer in the through-wafer via opening forms an electrical connection between the substrate and the through-wafer via pad. The method further includes forming a second conductive layer on the backside surface of the processed wafer, where the second conductive layer is in electrical contact with the first conductive layer and the substrate.

19 Claims, 9 Drawing Sheets

US 7,704,874 B1

METHOD FOR FABRICATING A FRONTSIDE THROUGH-WAFER VIA IN A PROCESSED WAFER AND RELATED STRUCTURE

BACKGROUND OF THE INVENTION

The present application claims the benefit of and priority to a pending provisional patent application entitled "Method for Fabricating a Frontside Through-Wafer Via in a Processed Wafer and Related Structure," Ser. No. 60/849,140 filed on Oct. 2, 2006. The disclosure in that pending provisional application is hereby incorporated fully by reference into the present application.

1. Field of the Invention

The present invention is generally in the field of fabrication of semiconductor devices. More particularly, the invention is in the field of fabrication of conductive structures in semiconductor wafers.

2. Background Art

Semiconductor devices, such as bipolar transistors and field effect transistors (FETs) that are fabricated using silicon or gallium arsenide technology, continue to increase in frequency, speed, and power. As a result, current semiconductor devices, such as bipolar transistors and FETs that are fabricated on a semiconductor wafer, also require conductive structures that provide effective, reduced impedance ground paths in the semiconductor wafer on which the devices are fabricated. For example, applications using silicon-based bipolar transistors can require a conductive structure that provides a reduced impedance path between emitter and ground, while silicon-based FETs can require a conductive structure that provides a lower impedance path between source and ground.

Also, current semiconductor devices, such as bipolar transistors and FETs that operate at increased power, also require conductive structures that provide more efficient thermal conduits to transfer heat away from the semiconductor device. For example, silicon-based bipolar transistors having increased power-handling capability can require conductive structures that provide more efficient transfer of heat to prevent excessive heat from damaging the transistor and/or resulting in degraded device performance.

Thus, there is a need in the art for an effective method for fabricating a conductive structure that provides a reduced impedance ground path and a more efficient thermal conduit for semiconductor devices.

SUMMARY OF THE INVENTION

A method for fabricating a frontside through-wafer via in a processed wafer and related structure, substantially as shown in and/or described in connection with at least one of the figures, as set forth more completely in the claims.

DETAILED DESCRIPTION OF THE INVENTION

The present invention is directed to a method for fabricating a frontside through-wafer via in a processed wafer and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
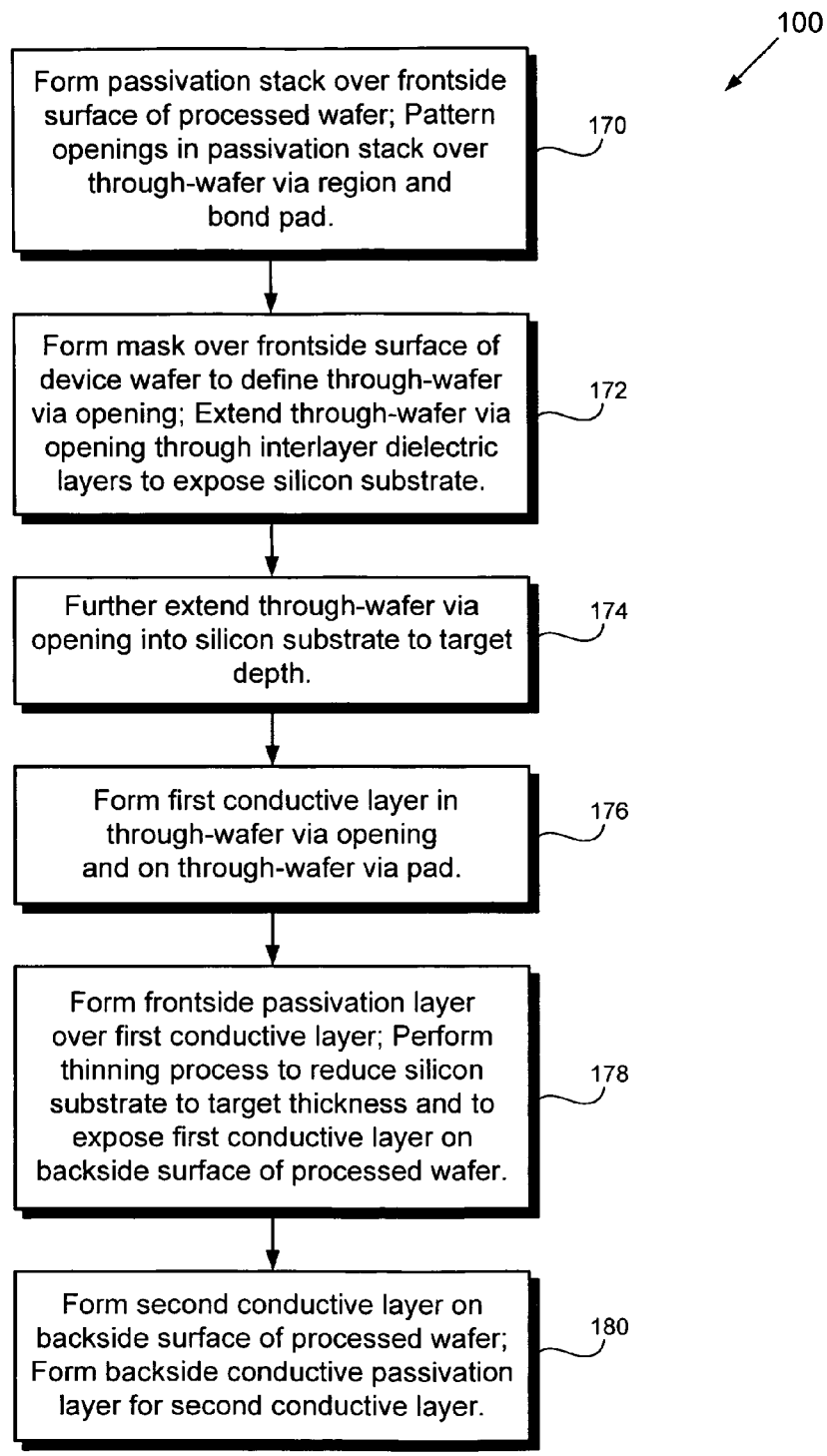
FIG. 1 shows a flowchart illustrating the steps taken to implement an embodiment of the present invention.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe three embodiments of the present invention; however, other embodiments of the invention may utilize steps different from those shown in flowchart 100. It is noted that the processing steps shown in flowchart 100 are performed on a portion of processed wafer, which, prior to step 270, includes, among other things, a substrate, multiple interlayer dielectric layers and interconnect metal layers, and one or more semiconductor devices, such as bipolar transistors and/or CMOS devices. The processed wafer is also referred to simply as a wafer or a semiconductor die or simply a die in the present application.

Moreover, structures 270 through 280 in FIGS. 2A through 2H illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth. It is noted that the result of performing processing step 176 of flowchart 100 is illustrated by respective structures 276a, 276b, and 276c in FIGS. 2D, 2E, and 2F, which illustrate three embodiments of the invention.

Figure 2A:
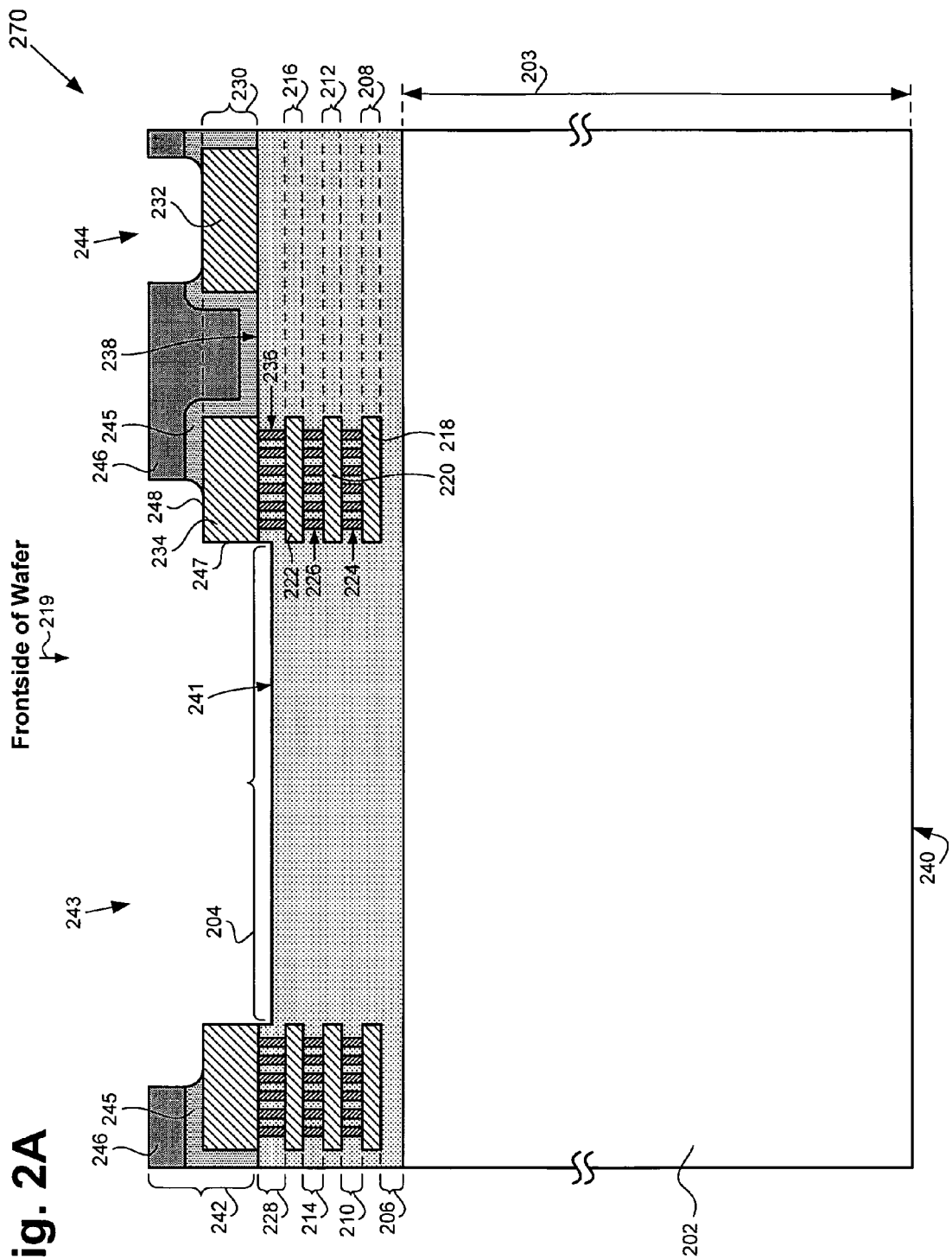
FIG. 2A illustrates a cross-sectional view, which includes a portion of a wafer processed according to an embodiment of the invention, corresponding to an initial step in the flowchart in FIG. 1.

Referring now to FIG. 2A, structure 270 of FIG. 2A shows a structure including a substrate, after completion of step 170 of flowchart 100 in FIG. 1. In structure 270, the frontside of the wafer is indicated by arrow 219. In structure 270, substrate 202 can comprise silicon and has initial thickness 203, which can be approximately 725.0 microns in an eight inch diameter silicon wafer, for example. In another embodiment, substrate 202 can comprise gallium arsenide (GaAs). Also in structure 270, interlayer dielectric layer 206 is situated over substrate 202, interconnect metal layer 208 is situated over interlayer dielectric layer 206, interlayer dielectric layer 210 is situated over interconnect metal layer 208, interconnect metal layer 212 is situated over interlayer dielectric layer 210, interlayer dielectric layer 214 is situated over interconnect metal layer 212, and interconnect metal layer 216 is situated over interlayer dielectric layer 214. Each of interlayer dielectric layers 206, 210, and 214 can comprise silicon oxide or other suitable dielectric material and can be formed by utilizing a chemical vapor deposition (CVD) process or other suitable deposition processes.

Interconnect metal layers 208, 212, and 216 can be respective first (i.e. M1), second (i.e. M2), and third (i.e. M3) interconnect metal layers in the processed wafer and can each comprise copper, aluminum, or other suitable metal. Also in structure 270, interconnect metal segments 218, 220, and 222 are situated in respective interconnect metal layers 208, 212, and 216. Interconnect metal segments 218, 220, and 222 can provide ground connections for respective interconnect metal layers 208, 212, and 216. In structure 270, interconnect metal segment 220 is connected to interconnect metal segment 218 by vias 224, which are situated in interlayer dielectric layer 210, and interconnect metal segment 222 is connected to interconnect metal segment 220 by vias 226, which are situated in interlayer dielectric layer 214. Vias 224 and 226, which are conventional vias, can comprise tungsten, copper, aluminum, or other suitable metal and can be formed in a manner as known in the art.

Also in structure 270, interlayer dielectric layer 228 is situated over interconnect metal layer 216 and interconnect metal layer 230 is situated over interlayer dielectric layer 228. Interlayer dielectric layer 228 can comprise silicon oxide or other suitable dielectric material and can be formed by using a CVD process or other suitable deposition processes. Interconnect metal layer 230 can be a fourth (i.e. M4) interconnect metal layer in the processed wafer, can comprise copper, aluminum, or other suitable metal, and can be formed in a manner known in the art. In one embodiment, interconnect metal layer 230 can have a thickness of between 0.5 microns and 10.0 microns, for example.

Also in structure 270, bond pad 232 and through-wafer via pad 234 are situated in interconnect metal layer 230. Bond pad 232 can be, for example, a signal bond pad, and can be coupled by an interconnect structure (not shown in FIG. 2A) to a semiconductor device (not shown in FIG. 2A) in the processed wafer. Through-wafer via pad 234 can be ground in interconnect metal layer 230. In the present embodiment, through-wafer via pad 234 can be electrically connected to interconnect metal segment 222 by vias 236, which are electrically connected to interconnect segments 218 and 220. In other embodiments, through-wafer via pad 234 can electrically connect a subsequently-fabricated through-wafer via to one or more of interconnect metal segments 218, 220, and 222.

Vias 236, which are situated in interlayer dielectric layer 228, are substantially similar in composition and formation to vias 224 and 226. In structure 270, the frontside surface of the processed wafer (hereinafter "frontside surface 238") refers the top surface of the processed wafer after bond pad 232 and through-wafer via pad 234 have been fabricated over interlayer dielectric layer 228. Thus, frontside surface 238 includes the top surface of interlayer dielectric layer 228 and the top and sidewall surfaces of bond pad 232 and through-wafer via pad 234. In structure 270, the initial backside surface of the processed wafer (hereinafter "initial backside surface 240") also refers to the initial bottom surface of substrate 202. In the present embodiment, a frontside through-wafer via is fabricated in a processed wafer that includes four interlayer dielectric layers (e.g. interlayer dielectric layers 206, 210, 214, and 228). In other embodiments, a frontside through-wafer via can be fabricated in a processed wafer that includes less than four interlayer dielectric layers or more than four interlayer dielectric layers. It is noted that only interconnect metal segments 218, 220, and 222, vias 224, 226, and 236, and through-wafer via pad 234 are specifically discussed herein to preserve brevity.

Referring now to step 170 in FIG. 1 and structure 270 in FIG. 2A, at step 170 of flowchart 100, passivation stack 242 is formed over frontside surface 238 and through-wafer via region opening 243 and bond pad opening 244 are formed in passivation stack 242 over respective through-wafer via region 204 and bond pad 232, respectively. Passivation stack 242 is situated over frontside surface 238 and includes lower passivation layer 245 and upper passivation layer 246. Lower passivation layer 245 is situated on frontside surface 238 and can comprise a layer of silicon nitride situated over a layer of silicon oxide, a layer of silicon only, a layer of silicon nitride only, or stacks of silicon oxide and silicon nitride layers. For example, lower passivation layer 245 can be formed by using a CVD process or other suitable deposition processes to deposit a layer of silicon oxide on frontside surface 238 and to deposit a layer of silicon nitride on the layer of silicon oxide. Upper passivation layer 246 is utilized to planarize the resulting wafer surface after lower passivation layer 245 has been formed on frontside surface 238 and can comprise photoimageable polyimide. Upper passivation layer 246 can be formed by depositing a layer of photoimageable polyimide on lower passivation layer 245 by spin coat, exposure and bake sequence or other suitable deposition processes. In one embodiment, upper passivation layer 246 can comprise non-photoimageable polyimide wherein the polyimide can be dry etched or lift-off polymers. In one embodiment, upper passivation layer 246 can comprise a dielectric material other than polyimide. In another embodiment, upper passivation layer 246 may not exist.

Through-wafer via region opening 243 is formed in passivation stack 242 to expose top surface 241 of interlayer dielectric layer 228 in through-wafer via region 204 and sidewall 247 and to expose a portion of top surface 248 of through-wafer via pad 234, and bond pad opening 244 is formed in passivation stack 242 to expose bond pad 232. Through-wafer via region opening 243 and bond pad opening 244 can be formed by the same masking step, which can comprise a pad opening reticle over passivation stack 242. Through-wafer via region opening 243 and bond pad opening 244 can then be formed in upper passivation layer 246 by utilizing a suitable developing process to remove photoimageable polyimide in unmask (i.e. exposed) portions of upper passivation layer 246. Through-wafer via region opening 243 and bond pad opening 244 can then be extended through lower passivation layer 245 by utilizing, for example, a dry etch process including a dry etchant, such as sulphur hexafluoride (SF6), nitrogen trifluoride (NF3), and/or fluorocarbon (i.e. CxFy) gases, to remove unmasked portions of lower passivation layer 245. During the dry etch process utilized to etch lower passivation layer 245, small amounts of interlayer dielectric layer 228 and bond pad 232 are removed as a result of over-etching.

In another embodiment, upper passivation layer 246 may be added after through-wafer via region opening 243 and bond pad opening 244. The upper passivation layer may comprise dielectrics such as silicon oxide, silicon nitride or polyimides. An additional masking step is then needed to open through wafer via region opening 243 to remove the material deposited in upper passivation layer 246. The bond pad opening region has the upper passivation layer 246 to protect the pad opening surface from subsequent processing steps and can be opened at a later stage during the process flow. The result of step 170 of flowchart 100 is illustrated by structure 270 in FIG. 2A.

Figure 2B:
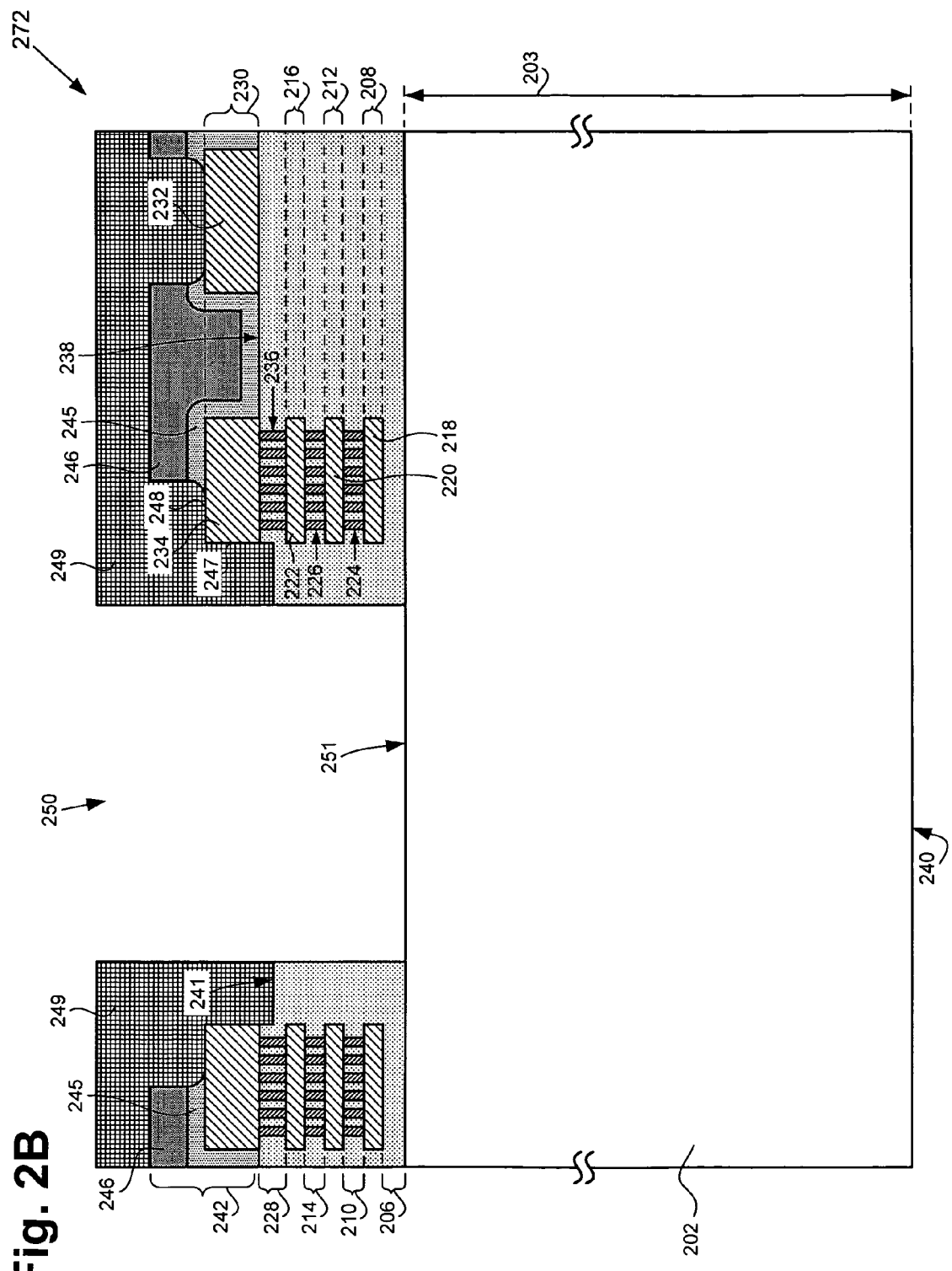
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, mask 249 is formed over frontside surface 238 in through-wafer via region 204 to define through-wafer via opening 250, and through-wafer via opening 250 is extended through interlayer dielectric layers 228, 214, 210, and 206 to expose substrate 202. Mask 249 is situated over passivation stack 242 and over frontside surface 238 and can comprise photoresist or other suitable masking material. Mask 249 can be formed by depositing and patterning a layer of masking material such as photoresist in a manner known in the art. Through-wafer via opening 250, which is defined by mask 249, can be extended through interlayer dielectric layers 228, 214, 210, and 206 by utilizing a suitable etch process to sequentially remove oxide material in interlayer dielectric layers 228, 214, 210, and 206. The etch process can be selective to silicon so as to stop at top surface 251 of substrate 202. The result of step 172 of flowchart 100 is illustrated by structure 272 in FIG. 2B.

Figure 2C:
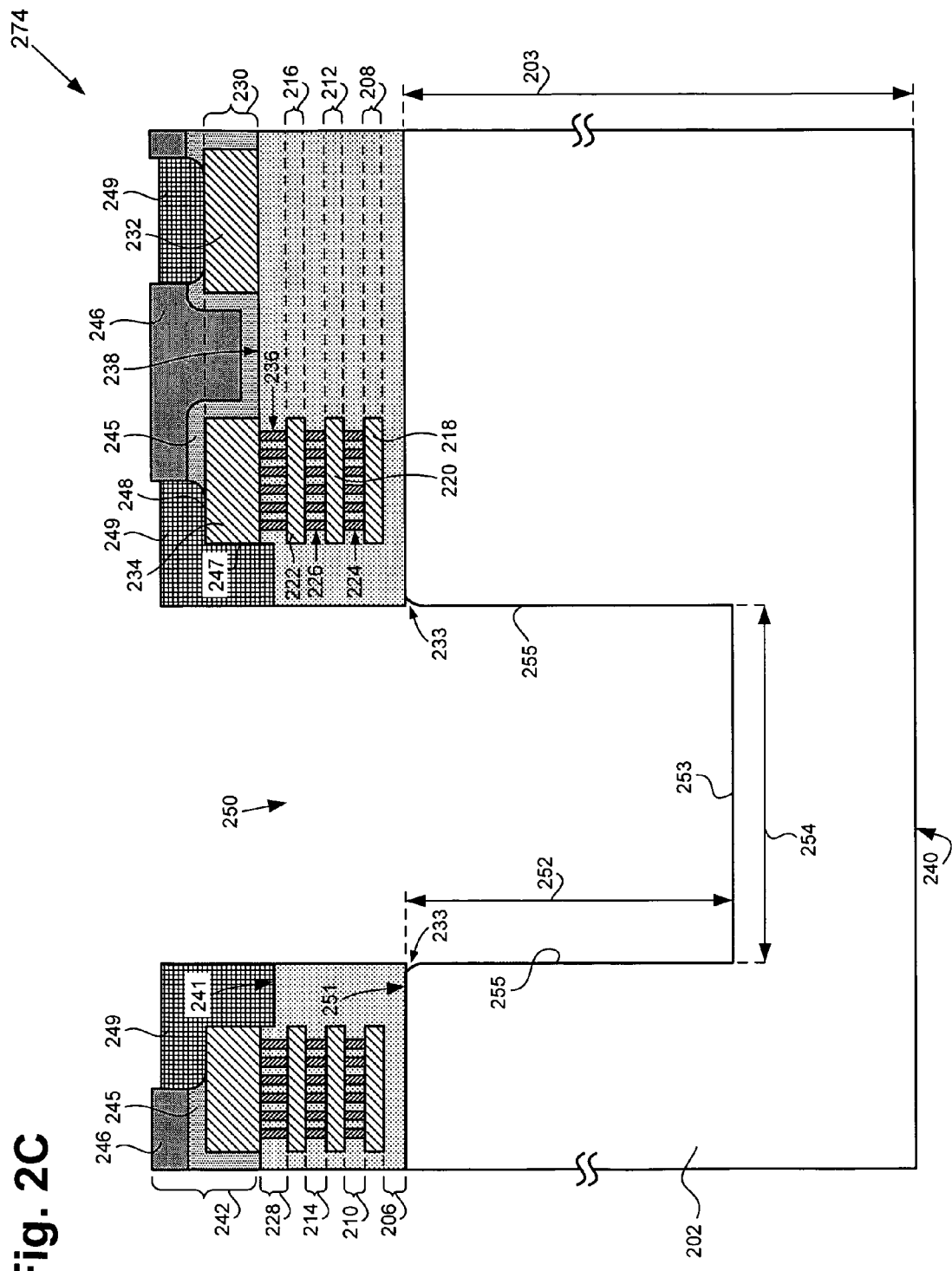
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, through-wafer via opening 250 is further extended into substrate 202 to target depth 252. Through-wafer via opening 250 extends through interlayer dielectric layers 228, 214, 210, and 206 and a portion of substrate 202 to target depth 252, which corresponds to the distance between top surface 251 of substrate 202 and bottom surface 253 of through-wafer via opening 250. In other words, target depth 252 is the distance that bottom surface 253 of through-wafer via opening 250 extends below top surface 251 of substrate 202. For example, target depth 252 can be between 25.0 microns and 400.0 microns. Through-wafer via opening 250 has width 254, which can be between 2.0 microns and 100.0 microns, for example. Through-wafer via opening 250 can be extended into substrate 202 by using an anisotropic deep reactive-ion etching (DRIE) process, for example.

In a DRIE process, such as a DRIE process based on the Bosch process, sequential repetitions of an etch step and polymer-deposition step are utilized to achieve a high silicon etch rate with an anisotropic profile (i.e. substantially vertical sidewalls). A sulfur hexafluoride ($SF_6$) etchant can be utilized to etch silicon in the etch step of the DRIE process, for example. In the polymer-deposition step, for example, a fluorocarbon (i.e. CxFy) based etchant can be utilized to deposit a fluorocarbon polymer film on sidewalls 255 of through-wafer via opening 250 to provide protection from undesirable lateral etching. Non-Bosch DRIE processes can also be used to obtain tapered (non-vertical) sidewalls in silicon as well as gallium arsenide substrates.

During the DRIE process, undercut 233 of the substrate may be formed. This may prevent continuous adhesion/barrier layer deposition during subsequent steps in the undercut region. To ensure continuous adhesion/barrier layer deposition, the substrate undercut (e.g. undercut 233) can be either offset after it has formed or prevented from forming. For example, the substrate undercut can be offset by using a wet etch process that is selective to silicon to increase the through-wafer via width in the interlayer dielectric region (i.e. interlayer dielectric layers 206, 210, 214, and 228) while causing only a minimal etching of the through-wafer via in the silicon substrate. The wet etch process can utilize wet etch chemistries using hydrofluoric acid and/or phosphoric acid, for example. For example, the substrate undercut can be prevented from forming by utilizing an oversized mask to etch the through-wafer via in the interlayer dielectric region (i.e. interlayer dielectric layers 206, 210, 214, and 228) and then utilizing an undersized mask to etch the through-wafer via in the substrate. This approach can prevent the substrate undercut from forming if the overlap of the two masks is greater than the depth of any substrate undercut that would otherwise form. The result of step 174 of flowchart 100 is illustrated by structure 274 in FIG. 2C.

Figure 2D:
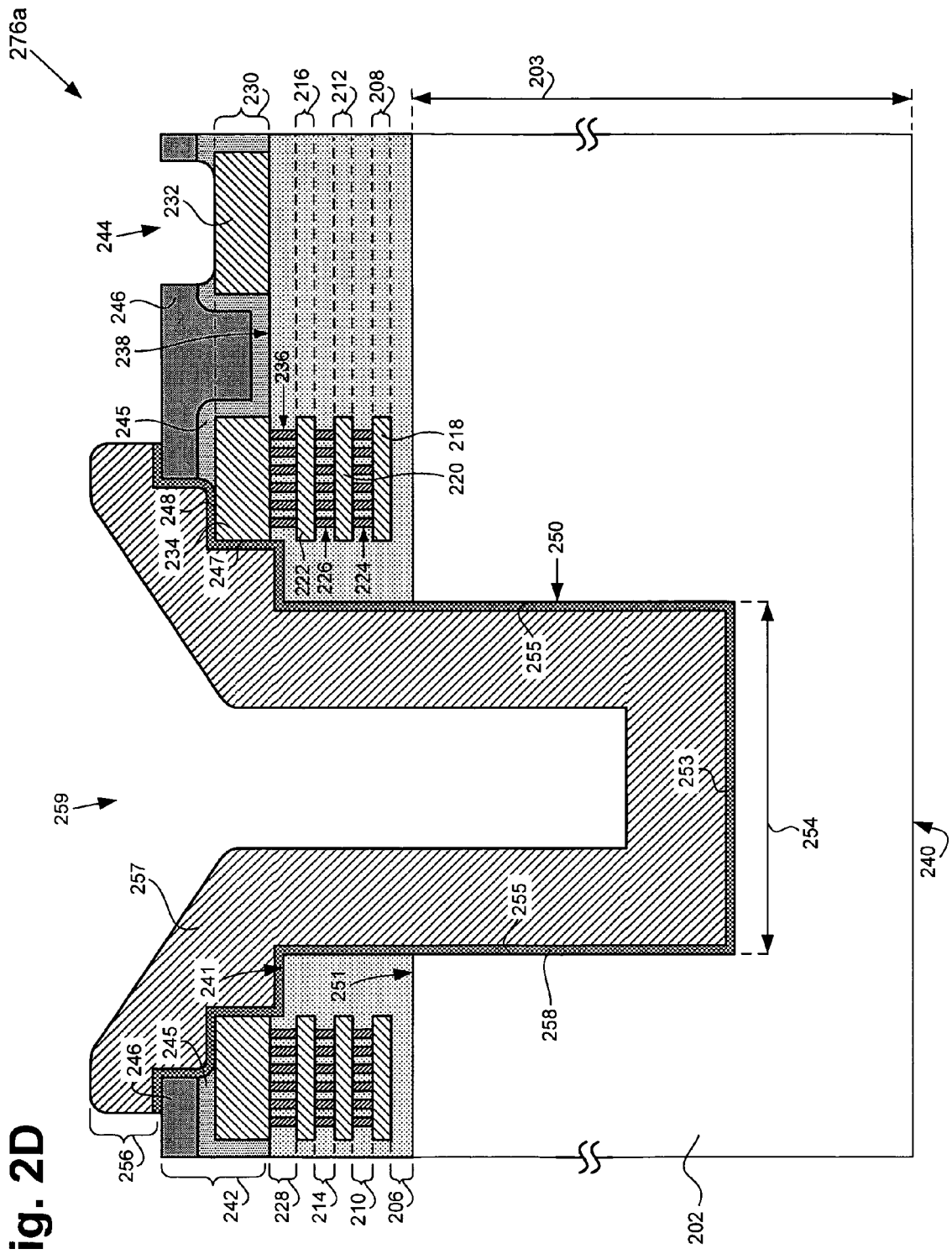
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276a in FIG. 2D, at step 176 of flowchart 100, conductive layer 256, which includes metal layer 257 and adhesion/barrier layer 258, is formed in through-wafer via opening 250 and on sidewall 247 and top surface 248 of through-wafer via pad 234. It is noted that step 176 of flowchart 100 in FIG. 1 is also illustrated by structure 276b in FIG. 2E and by structure 276c in FIG. 2F, which correspond to different embodiments of the invention. Prior to formation of conductive layer 256, mask 249 (shown in FIG. 2C) is removed and a clean process is performed to remove any unwanted material, such as native oxide, on sidewalls 255 and bottom surface 253 of through-wafer via opening 250 and on frontside surface 238. Mask 249 (shown in FIG. 2C) can be removed by utilizing a wet strip process or a dry strip process. The clean process can be an argon (Ar) presputter clean process, for example, which can be performed in a manner known in the art.

Adhesion/barrier layer 258 is situated on sidewalls 255 and bottom surface 253 of through-wafer via opening 250, on top surface 241 of interlayer-dielectric layer 228, sidewall 247 and top surface 248 of through-wafer via pad 234, and passivation stack 242. Adhesion/barrier layer 258 can comprise titanium-tungsten (TiW), tantalum/tantalum nitride (Ta/TaN), titanium/titanium nitride (Ti/TiN), tungsten, or combinations of these layers, for example. Metal layer 257 is situated on adhesion/barrier layer 258 and can comprise copper. In other embodiments, metal layer 257 can comprise aluminum, tungsten or other suitable metal or metal stack. In the present embodiment, metal layer 257 does not completely fill through-wafer via opening 250. In other embodiments, metal layer 257 can completely fill through-wafer via opening 250.

Conductive layer 256 can be formed by depositing adhesion/barrier layer 258 on sidewalls 255 and bottom surface 253 of through-wafer via opening 250, and the entire exposed frontside surface of the wafer, including frontside surface 238, passivation stack 242, and on bond pad opening 244, by utilizing, for example, a physical vapor deposition (PVD) process or a CVD process. A seed layer (not shown in FIG. 2D) comprising copper can then be depositing on adhesion/barrier layer 258 by using a PVD or a CVD process. In the present embodiment, a copper electrochemical deposition (ECD) mask (not shown in FIG. 2D) can then be formed on the seed layer (not shown in FIG. 2D). Next, a thick layer of copper can be deposited in an opening in the ECD mask (not shown in FIG. 2D) by utilizing an electrochemical deposition process or other suitable deposition processes to form metal layer 257. After metal layer 257 has been formed, the ECD mask (not shown in FIG. 2D) can be removed by utilizing a wet strip process or other suitable process.

After the ECD mask (not shown in FIG. 2D) has been removed, portions of the seed layer (not shown in FIG. 2D) and adhesion/barrier layer 258 that are not protected by (i.e. not situated under) metal layer 257 can be removed from passivation stack 242 and frontside surface 238 by utilizing, a wet etch process or a dry etch process. Next, a copper anneal process, which is optional, can be performed in a manner known in the art. Thus, as shown in FIG. 2D, through-wafer via 259, which is also referred to as a "frontside through-wafer via" in the present application, includes through-wafer via opening 250 and conductive layer 256, which includes adhesion/barrier layer 258 and metal layer 257. The result of step 176 of flowchart 100 is illustrated by structure 276a in FIG. 2D. Although a copper conductor process has been described, the conductor material for layer 257 can comprise tungsten, gold, and/or aluminum.

In the present embodiment, conductive layer 256 is in direct contact with sidewall 247 and top surface 248 of through-wafer via pad 234 and is not in direct contact with the interconnect metal segments 218, 220, and 222 in respective interconnect metal layers 208, 212, and 216. In one embodiment, conductive layer 256 can be in direct contact with top surface 248 of through-wafer via pad 234 and can be insulated from sidewall 247 of through-wafer via pad 234. In another embodiment, conductive layer 256 can be in direct contact with interconnect metal segments 218, 220, and 222, and sidewall 247 of through-wafer via pad 234. In other embodiments, conductive layer 256 can be in direct contact with one or more of interconnect metal segments 218, 220, and 222 and sidewall 247 of through-wafer via pad 234.

Figure 2E:
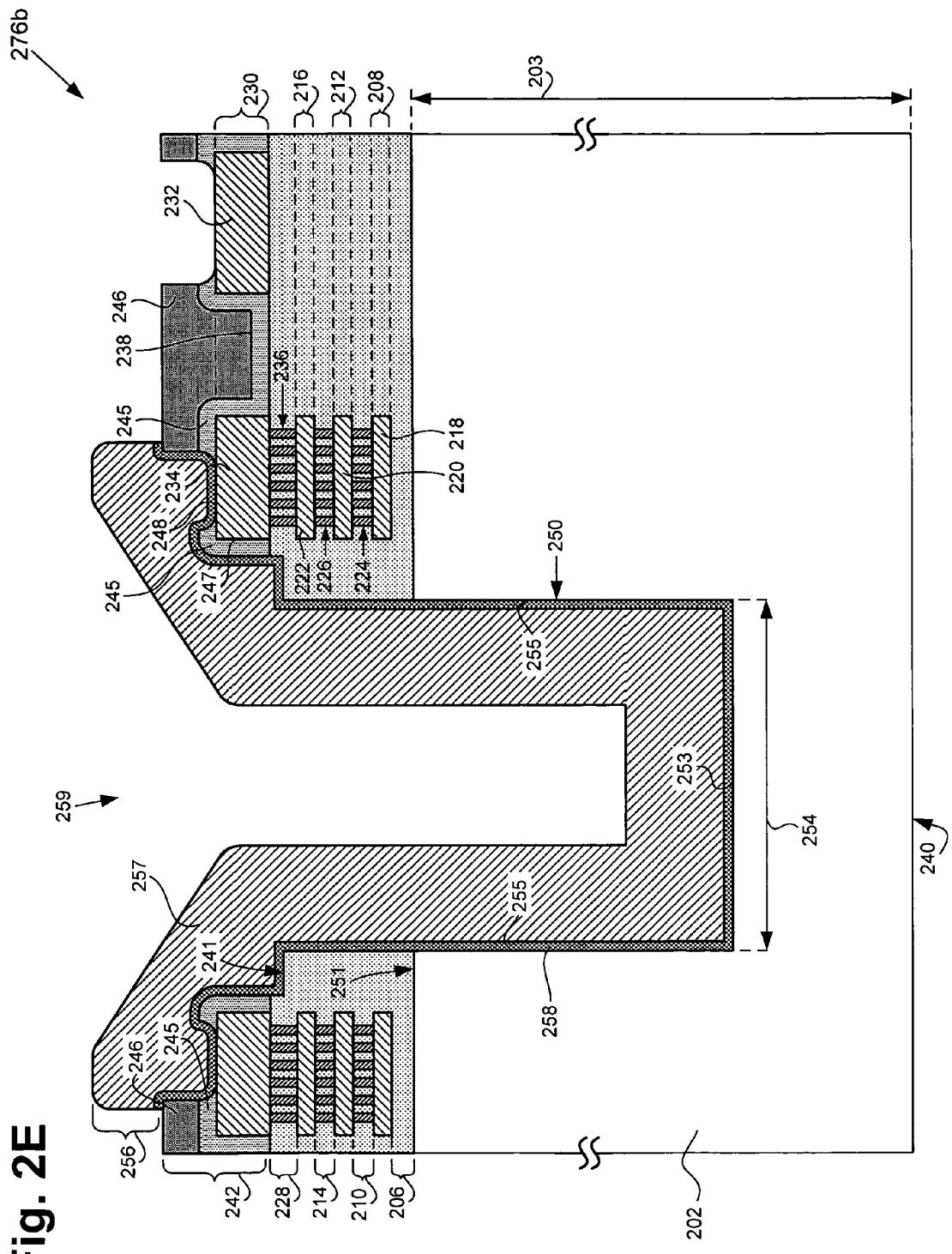
FIG. 2E illustrates a cross-sectional view, which includes a portion of a wafer processed according to an embodiment of the invention, corresponding to an intermediate step in the flowchart in FIG. 1.

Referring to step 176 in FIG. 1 and structure 276b in FIG. 2E, an embodiment of the invention is shown in which conductive layer 256 is insulated from sidewall 247 of through-wafer via pad 234. It is noted that the same numerals refer to the same elements in FIGS. 2D and 2E. As shown in structure 276b in FIG. 2E, a portion of lower passivation layer 245 is situated on sidewall 247 of through-wafer via pad 234. Since lower passivation layer 245 comprises a dielectric material (e.g. a layer of silicon nitride over a layer of silicon oxide), lower passivation layer 245 insulates sidewall 247 from conductive layer 256. Also shown in structure 282, conductive layer 256 is situated on top surface 248 of through-wafer via pad 234. Thus, in the embodiment in FIG. 2E, conductive layer 256 is in direct contact with through-wafer via pad 234 at only top surface 248 and is insulated from sidewall 247 of through-wafer via pad 234. The embodiment in FIG. 2E can be formed by changing the masking pattern during the process step (i.e. step 170 of flowchart 100 in FIG. 1) of forming through-wafer region opening 243 and bond pad opening 244 in FIG. 2A.

Figure 2F:
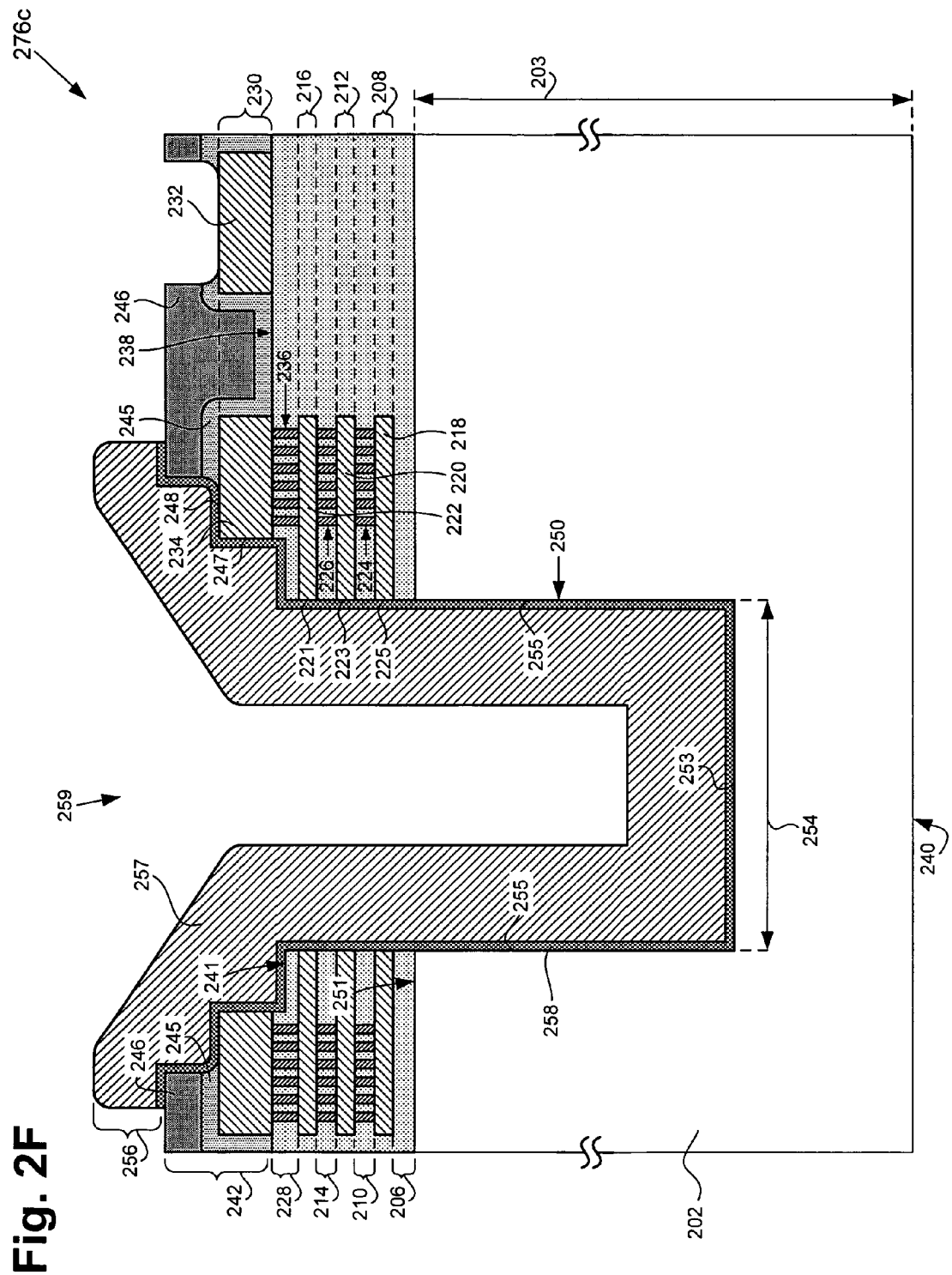
FIG. 2F illustrates a cross-sectional view, which includes a portion of a wafer processed according to an embodiment of the invention, corresponding to an intermediate step in the flowchart in FIG. 1.

Referring to step 176 in FIG. 1 and structure 276c in FIG. 2F, an embodiment of the invention is shown in which conductive layer 256 is in direct contact with interconnect metal segments 218, 220, and 222 in respective interconnect metal layers 208, 212, and 216 and with sidewall 247 of through-wafer via pad 234. It is noted that the same numerals refer to the same elements in FIGS. 2D and 2F. As shown in structure 276c in FIG. 2F, conductive layer 256 is situated on sidewalls 221, 223, and 225 of respective interconnect metal segments 222, 220, and 218 and situated on sidewall 247 of through-wafer via pad 234. Thus, in the embodiment of the invention in FIG. 2F, conductive layer 256 is in direct contact with interconnect metal segments 222, 220, and 218 and in direct contact with sidewall 247 of through-wafer via pad 234. Thus, in the embodiment of the invention in FIG. 2F, conductive layer 256 is in direct contact with interconnect metal layers 208 (e.g. M1), 212 (e.g. M2), 216 (e.g. M3), and 230 (e.g. M4).

Figure 2G:
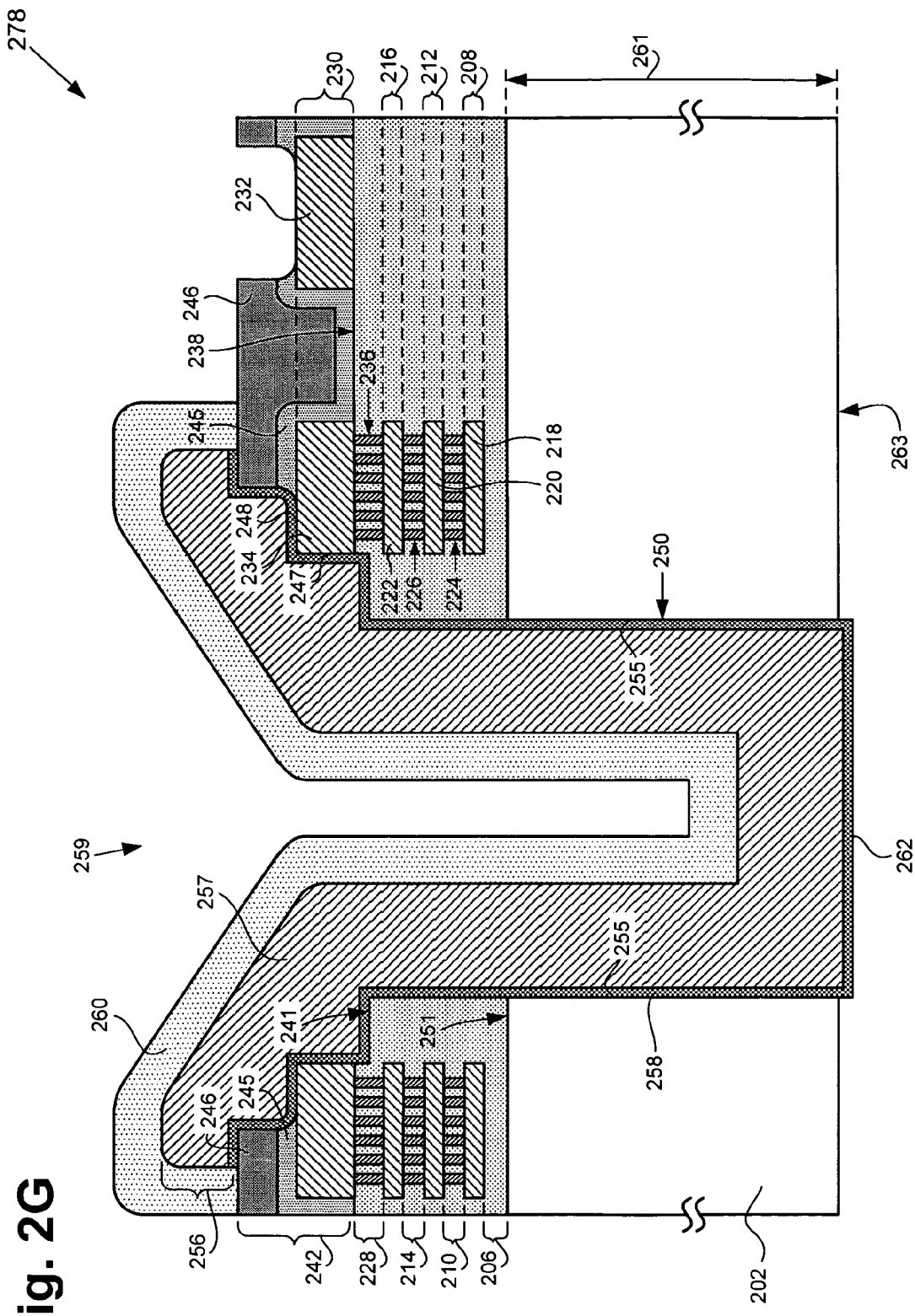
FIG. 2G illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2G, at step 178 of flowchart 100, frontside passivation layer 260 is formed over conductive layer 257 of through-wafer via 259 and a thinning process is performed to reduce substrate 202 to target thickness 261 and to expose bottom portion of conductive layer 256. Although structure 278 in FIG. 2G illustrates the result of performing step 178 of flowchart 100 on structure 276a in FIG. 2D, it is appreciated by one or ordinary skill in the art that step 178 of flowchart 100 can also be performed in a substantially similar manner on either structure 276b in FIG. 2E and or structure 276c in FIG. 2F.

Frontside passivation layer 260, which is formed to prevent oxidation of metal layer 257 as well as for mechanical damage protection during subsequent die handling steps while packaging, is situated on conductive layer 256 of through-wafer via 259 and can comprise photoimageable polyimide or benzocyclobutene (BCB). In one embodiment, frontside passivation layer 260 can comprise non-photoimageable polyimide. In another embodiment, frontside passivation layer 260 can be formed on conductive layer 257 using a maskless process by utilizing an electroless plating process which may comprise a nickel/gold (Ni/Au) stack. In the present embodiment, frontside passivation layer 260 can be formed by depositing a layer of photoimageable polyimide or BCB on conductive layer 256 and over frontside surface 238 and appropriately patterning the layer of photoimageable polyimide or BCB.

Target thickness 261 of substrate 202 can be approximately the same as target depth 252 shown in FIG. 2C, for example. Bottom portion 262 of conductive layer 256 of through-wafer via 259 has to be exposed on the final backside surface of the processed wafer (hereinafter "final backside surface 263"), which also refers to the final bottom surface of substrate 202. Substrate 202 can be reduced to target thickness 261 by performing a thinning process including a coarse silicon removal step and a fine silicon removal step. The coarse silicon removal step can be performed by utilizing a back-grinding process to reduce the thickness of substrate 202 to within approximately 25.0 microns of target thickness 262 without exposing conductive layer 256 of through-wafer via 259. After the coarse silicon removal step has been performed, a carrier wafer can be temporarily attached to the frontside of the processed wafer so as to support the thinned wafer during the fine silicon removal step. The carrier wafer can comprise silicon, sapphire, or glass and can be perforated or non-perforated, the latter enabling easier debond techniques. The carrier wafer can be mounted to the processed wafer by utilizing a temporary adhesive, such as laminated thermal adhesive film, ultraviolet curable film, or other suitable bonding materials as are known in the art. In one embodiment, a carrier wafer may not be utilized. In another embodiment, the carrier wafer may be mounted before the beginning of the backgrinding process.

The fine silicon removal step can then be performed to reduce substrate 202 to target thickness 261 and to expose bottom portion 262 of conductive layer 256 on final backside surface 263. The fine silicon removal step can be performed by utilizing a fine chemical mechanical polishing (CMP)

process and/or an etch process, such as a suitable wet etch or dry etch process. An optional inspection process can be performed to inspect final backside surface 263 to verify that conductive layer 256 is exposed on final backside surface 263. In one embodiment, a mask can be formed on the backside surface of the processed wafer after the coarse silicon removal step has been performed and a suitable etch process can be performed to remove silicon material covering bottom portion 262 of conductive layer 256. In another embodiment, the fine silicon removal step is performed first using a wet or dry etch process to expose all of the through-wafer vias across the wafer, followed by CMP step to remove the portions of the vias sticking out of the backside surface 263. The result of step 178 of flowchart 100 is illustrated by structure 278 in FIG. 2G. It is appreciated by one of ordinary skill in the art that the result of performing step 178 of flowchart 100 on structure 176b in FIG. 2E or on structure 176c in FIG. 2F can also be illustrated by structure 278 in FIG. 2G.

Figure 2H:
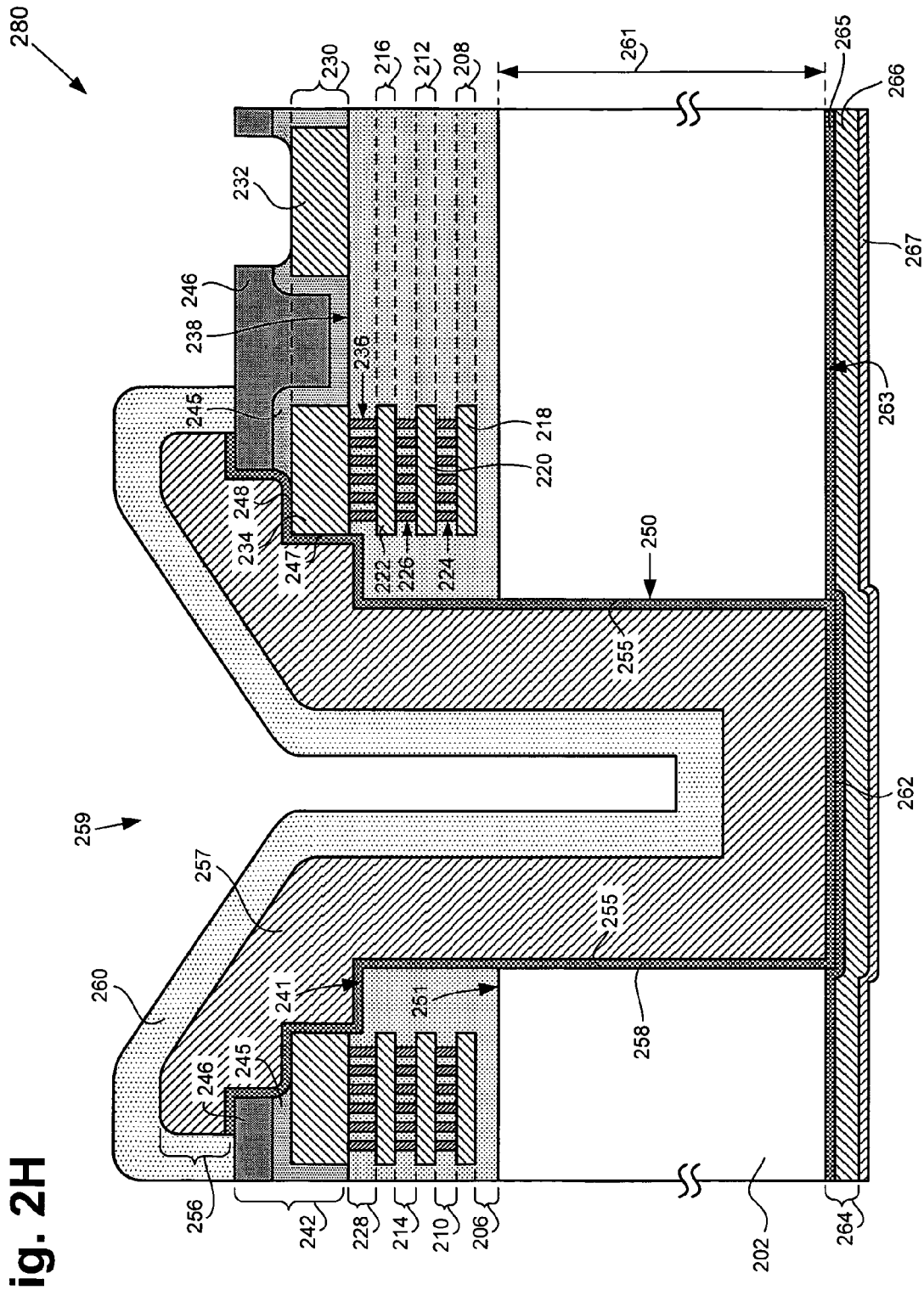
FIG. 2H illustrates a cross-sectional view, which includes a portion of a wafer processed according to an embodiment of the invention, corresponding to a final step in the flowchart in FIG. 1.

Referring to step 180 in FIG. 1 and structure 280 in FIG. 2H, at step 180 of flowchart 100, conductive layer 264, which includes adhesion/barrier layer 265 and backside metallization layer 266, is formed on final backside surface 263 and backside passivation layer 267 is formed on conductive layer 264. Prior to forming conductive layer 264, a clean process can be performed to remove unwanted material, such as native oxide, from final backside surface 263 by utilizing an argon (Ar) sputter process or other suitable processes. Adhesion/barrier layer 265 of conductive layer 264 is situated on final backside surface 263 and can comprise titanium-tungsten (TiW), tantalum/tantalum nitride (Ta/TaN), or titanium/titanium nitride (Ti/TiN), tungsten, or combinations of these layers, for example. Adhesion/barrier layer 265 can be formed on final backside surface 263 by utilizing, for example, a PVD process or a CVD process. Backside metallization layer 266 of conductive layer 264 is situated on adhesion/barrier layer 265 and can comprise copper. In other embodiments, backside metallization layer 266 can comprise aluminum, gold, other suitable metal, or a suitable metal alloy. In the present embodiment, backside metallization layer 266 can be formed by first depositing a copper seed layer (not shown in FIG. 2H) on adhesion/barrier layer 265 by utilizing a PVD process or a CVD process. A substantially thicker layer of copper can then be deposited on the copper seed layer (not shown in FIG. 2H) by utilizing an electrochemical deposition process or other suitable deposition processes.

Backside passivation layer 267 is situated on backside metallization layer 266 of conductive layer 264 to prevent backside metallization layer 266 from oxidizing as well as for the die to be bonded to the package substrate. Backside passivation layer 267 is a conductive layer and can comprise, for example, nickel-gold (Ni/Au) or other suitable metals. Backside passivation layer 267 can be formed, for example, by depositing a layer nickel-gold on backside metallization layer 266 by utilizing an electroless plating process or other suitable deposition processes. After backside passivation layer 267 has been formed, the carrier wafer can be removed from the frontside of the processed wafer in a manner known in the art.

In the embodiments in FIGS. 1 and 2A through 2H, through-wafer via 259 provides a large-size, conductive structure that extends through a processed wafer and is in electrical contact with through-wafer via pad 234, substrate 202, and conductive layer 264 on final backside surface 263. Also, through-wafer via pad 234 is electrically connected to ground in interconnect metal layer 230 and electrically connected to interconnect metal segments 218, 220, and 222, which are electrically connected to ground in respective interconnect metal layers 208, 212, and 216. Thus, through-wafer via 259 advantageously provides an effective, low impedance ground conduit for semiconductor devices that are fabricated on the processed wafer. Additionally, since through-wafer via 259 extends through the processed wafer and includes conductive layer 256, through-wafer via 259 also advantageously provides an efficient thermal conduit for transferring heat away from semiconductor devices that are fabricated on the processed wafer.

Thus, as discussed above, in the embodiments of FIGS. 1 and 2A through 2H, the invention achieves a frontside through-wafer via that extends through a processed wafer and is in electrical contact with a substrate to advantageously provide a low-resistance ground conduit and an effective thermal conduit for semiconductor devices fabricated in the processed wafer. It is understood to those of ordinary skill in the art that although the invention has been described in reference to a "wafer" or a "processed wafer," such wafer can be diced and singulated into individual dies and thereafter packaged using various semiconductor packaging techniques and processes. As such, the invention is manifestly applicable to fabricating wafers and/or dies, which may or may not be later packaged, in accordance with the teachings of the invention as described above.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for fabricating a frontside through-wafer via in a processed wafer and related structure have been described.

The invention claimed is:

1. A method for fabricating a frontside through-wafer via in a processed wafer, said processed wafer including a substrate, and at least one interlayer dielectric layer situated over said substrate, said method comprising steps of:
    forming a through-wafer via opening through said at least one interlayer dielectric layer in a through-wafer via region of said processed wafer;
    extending said through-wafer via opening through said substrate to a target depth;
    forming a first conductive layer in said through-wafer via opening;
    wherein said first conductive layer in said through-wafer via opening forms an electrical connection to said substrate along at least one vertical sidewall of said through-wafer via opening.

2. The method of claim 1 wherein said processed wafer includes a through-wafer via pad situated over said at least one interlayer dielectric layer, wherein said first conductive layer is formed in said though-wafer via opening and over said through-wafer via pad.

3. The method of claim 2 wherein said first conductive layer in said though-wafer via opening is in electrical contact with said through-wafer via pad.

4. The method of claim 1 further comprising a step of performing a thinning process to reduce said substrate to a target thickness and to expose a bottom portion of said first conductive layer on a backside surface of said processed wafer.

5. The method of claim 1 further comprising a step of forming a second conductive layer on said backside surface of said processed wafer, wherein said second conductive layer is in electrical contact with said first conductive layer and said substrate.

6. The method of claim 1 further comprising steps of:
forming a passivation stack over a frontside surface of said processed wafer prior to said step of forming said through-wafer via opening;
forming a through-wafer via region opening in said passivation stack to expose a top surface of said at least one interlayer dielectric layer.

7. The method of claim of 1 wherein said step of forming said first conductive layer comprises steps of:
forming an adhesion/barrier layer in said through-wafer via opening;
forming a metal layer over said adhesion/barrier layer.

8. The method of claim 7 further comprising a step of forming a frontside passivation layer over said metal layer.

9. The method of claim 1 further comprising dicing said processed wafer into a plurality of dies.

10. The method of claim 1 further comprising a step of utilizing a wet etch process to increase a width of said through-wafer via opening in said at least one interlayer dielectric layer to offset an undercut of said substrate.

11. A method for fabricating a through-wafer via in a semiconductor wafer, said method comprising:
forming a through-wafer via opening through at least one dielectric layer in said semiconductor wafer;
extending said through-wafer via opening through said semiconductor wafer;
forming a first conductive layer in said through-wafer via opening so as to form an electrical connection between said first conductive layer and a semiconductor substrate of said semiconductor wafer along at least one vertical sidewall of said through-wafer via opening.

12. The method of claim 11 wherein said semiconductor wafer includes a through-wafer via pad, and wherein said first conductive layer is in electrical contact with said through-wafer via pad.

13. The method of claim 11 further comprising thinning said semiconductor wafer to expose said first conductive layer on a surface of said semiconductor wafer.

14. The method of claim 11 further comprising forming a second conductive layer such that said second conductive layer forms an electrical connection with said first conductive layer and said semiconductor substrate.

15. The method of claim 11 further comprising:
forming a passivation stack over a surface of said semiconductor wafer prior to forming said through-wafer via opening;
opening said passivation stack to expose said at least one dielectric layer.

16. The method of claim of 11 wherein said forming said first conductive layer comprises:
forming an adhesion/barrier layer in said through-wafer via opening;
depositing a metal layer over said adhesion/barrier layer.

17. The method of claim 16 further comprising forming a passivation layer over said metal layer.

18. The method of claim 11 further comprising dicing said semiconductor wafer into a plurality of dies.

19. The method of claim 11 further comprising using a wet etch process to increase a width of said through-wafer via opening to offset an undercut of said semiconductor substrate.

* * * * *